(12) United States Patent
Shieh et al.

(10) Patent No.: US 8,216,872 B1
(45) Date of Patent: Jul. 10, 2012

(54) METHOD OF INTEGRATING LIGHT-TRAPPING LAYER TO THIN-FILM SOLAR CELL

(75) Inventors: Jia-Min Shieh, Hsinchu (TW);
Chang-Hong Shen, Hsinchu (TW);
Wen-Hsien Huang, Hsinchu (TW);
Shih-Chuan Wu, Hsinchu (TW);
Bau-Tong Dai, Hsinchu (TW); Jung Y. Huang, Hsinchu (TW); Hao-Chung Kuo, Hsinchu (TW)

(73) Assignee: National Applied Research Laboratories, Hsinchu (TW)

( * ) Notice: Subject to any disclaimer, the term of this patent is extended or adjusted under 35 U.S.C. 154(b) by 39 days.

(21) Appl. No.: 13/031,363

(22) Filed: Feb. 21, 2011

(51) Int. Cl.
*H01L 21/00* (2006.01)

(52) U.S. Cl. .............................. 438/69; 438/71; 438/85

(58) Field of Classification Search .................... 438/69, 438/71, 85
See application file for complete search history.

(56) References Cited

U.S. PATENT DOCUMENTS

| 6,991,958 B2 * | 1/2006 | Salafsky ........................ 438/63 |
| 7,572,974 B2 * | 8/2009 | Chittibabu et al. ........... 136/263 |
| 8,003,884 B2 * | 8/2011 | Miteva et al. ................. 136/263 |

* cited by examiner

*Primary Examiner* — Richard A. Booth
(74) *Attorney, Agent, or Firm* — Jackson IPG PLLC; Demian K. Jackson

(57) ABSTRACT

A light-trapping layer is integrated into a thin-film solar cell. It is integrated as a light-inlet layer, an intermediate layer or a shaded layer with nano-particles embedded in a transparent or non-transparent conductive film. Thus, light stays longer in an absorption layer with photocurrent increased; defects of interface between the absorption layer and the nano-material are decreased; anti-reflective effect to inlet light is enhanced; and a good integrity and a good reliability for long-time light-shining are obtained.

20 Claims, 10 Drawing Sheets

METHOD OF INTEGRATING LIGHT-TRAPPING LAYER TO THIN-FILM SOLAR CELL

TECHNICAL FIELD OF THE DISCLOSURE

The present disclosure relates to integrating a light-trapping layer; more particularly, relates to obtaining a composite light-trapping material having an absorption layer to be integrated as a light-inlet layer, an intermediate layer or a shaded layer of a thin-film solar cell.

DESCRIPTION OF THE RELATED ARTS

Thin-film solar cell is a main stream for future solar cell. Yet, because the absorption layer of the thin-film solar cell is much thinner than that of a crystalline silicon (Si) solar cell, the solar cell's absorption response of light spectrum is weak and photoconversion efficiency is thus reduced. Moreover, the thin absorption layer is not fit for traditional surface texturing for forming a light-trapping layer.

Nano-particles have good optical response characteristics, like light scattering, near-field enhancement and carrier injection, to effectively enhance optical path for increasing conversion efficiency of solar cells. However, on integrating components, nano-particles could produce extra interface defects and may destroy characteristics of an absorption layer.

Metal nano-particles and dielectric particles are widely used in light-emitting diodes (LED), chemical and biological detectors. Metal nano-particles are especially used in fabrication and detection owing to their various material characteristics. Surface plasmon of the metal nano-particles is a dipole or multiple moment formed by oscillation of electronic charge density from interaction between an electromagnetic wave and free electrons in metal. On resonating, the composite plasmon material generates extremely high extinction and strong near-field optical characteristics. According to Mie's theory, large-size metal nano-particles obtains their extinction coefficient mainly by scattering of the particles, where loss of heat from absorption is much less than gain of heat from scattering of the particles; and, small-size nano-particles' extinction coefficient is mainly obtained by absorbing particles to be converted into strong electromagnetic field nearby the nanoparticles. These scattering characteristics are related to materials, sizes and shapes of the particles that scattering directions may vary according to various wavelengths. Concerning strong near-field optical effect, it is related to particle sizes and surrounding environment. Hence, effective control on configuration of particle sizes and surrounding environment helps light-trapping in a-Si thin-film solar cells.

A few prior arts have been revealed concerning nano-materials for thin-film solar cells. But, their conversion efficiencies are not good enough, which are owing to defects on absorption layer or destructions on thin film during fabrication.

Atwater, etc. revealed a prior art in U.S. patent No. 2007/0289623. In FIG. 7, above an absorption layer 40, a plasmon resonance scattering layer 41 of aluminum (Al) and copper (Cu) nano-particles 411 generates an effect of light coupling waveguide through an inlet light, where scattering of the inlet light is enhanced and light absorption of the absorption layer 40 is further increased for improving photocurrent response. Nevertheless, Al and Cu particles 411 are located between the absorption layer 40 and air; and, because Al and Cu may be easily oxidized into $Al_2O_3$ and CuO on metal surface in air, the coupling effect of inlet light and metal particles may be reduced.

In FIG. 8, another prior art embedded 100 nm~200 nm metal particles 501 between a low-band-gap photo conversion layer 51 and a high-band-gap photoelectrical conversion layer 52 so that thickness of a tandem thin film photovoltaic device 5 having a plasmon structure 50 is reduced and photocurrent generation is enhanced. Therein, the plasmon structure 50 is formed by overlapping a high-band-gap amorphous silicon (a-Si) film (i.e. the high-band-gap photoelectrical conversion layer 52) and a low-band-gap a-Si film (i.e. the low-band-gap photoelectrical conversion layer 51). But, this kind of sandwitched structure may face some problems. One is that, no matter how the metal particles are embedded on the low-band-gap photoelectrical conversion layer, when the photoelectrical conversion layer is vacuumed for embedding the metal particles, some surface defects and a-Si degradation may be caused. Two is that, when a Si film is formed on the surface of metal particles through epitaxy with plasma, plasma ions bombing may destroy the surface of metal particles. These two problems both seriously affect photoelectric conversion efficiency.

Edward T. Yu, Daniel Derkacs, etc. revealed another prior art in U.S. patent No. 2009/0250110. In FIG. 9, Au particles (100 nano-meters (nm)) or silicon dioxide ($SiO_2$) particles (150 nm) are adhered on a transparent oxide layer 61 of indium tin oxide (ITO) through franklinism, where an n-i-p a-Si tandem layer 62 is laid under the transparent oxide layer 61. Through light scattering, its photocurrent is increased from 6.6 $mA/cm^2$ to 7.2 $mA/cm^2$ with its photoelectric conversion rate increased from 2.77% to 3%. Although the problem of surface defects is solved, a problem on contacting nano-particles with aluminum metal electrode still remains.

C. Lorenzetti, M. Vitale, etc. revealed another prior art in U.S. patent No. 2010/0000398. In FIG. 10, a photosensitive multi-layers having nano-particles are embedded in a phosphorus-doped and boron-doped Si film. But, this kind of structure still has the problems for the above prior arts. Then, another photosensitive structure is formed by doping multi-layers of nano-particles into a semiconductor material. If this kind of semiconductor material is not used as an absorption layer, a big problem will happen to photocurrent matching that not only generation of photocurrent may face difficulty but also photoelectric conversion rate may be reduced.

These prior arts use nano-particles in Si thin-film solar cell. But, most of them do not solve problems of surface defects on absorption layer and destruction on particles surface owing to plasma ion bombing. Hence, the prior arts do not fulfill all users' requests on actual use.

SUMMARY OF THE DISCLOSURE

The main purpose of the present disclosure is to obtain a composite light-trapping nano-material having an absorption layer to be integrated as a light-inlet layer, an intermediate layer or a shaded layer of a thin-film solar cell.

To achieve the above purpose, the present disclosure is a method of integrating a light-trapping layer to a thin-film solar cell, comprising steps of: (a) obtaining a substrate and obtaining a metal back reflector layer and a first transparent conductive oxide (TCO) layer on the substrate; (b) forming a first absorption layer on the first TCO layer through a plasma process; (c) forming a second TCO layer on the first absorption layer by using a mask; (d) forming a plasmonic nano-structured layer on the second TCO layer, where the plasmonic nanostructured layer comprises a plurality of nanoparticles; (e) forming a third TCO layer on the plasmonic nanostructured layer by using the mask; (f) etching the first absorption layer by using the third TCO layer as a shield; and (g) forming a metal grating on the third TCO layer by using another mask. Accordingly, a novel method of integrating a light-trapping layer to a thin-film solar cell is obtained.

BRIEF DESCRIPTIONS OF THE DRAWINGS

The present disclosure will be better understood from the following detailed description of the preferred embodiment according to the present disclosure, taken in conjunction with the accompanying drawings, in which FIG. 1 is the flow view showing the preferred embodiment according to the present disclosure;

DESCRIPTION OF THE PREFERRED EMBODIMENT

The following description of the preferred embodiment is provided to understand the features and the structures of the present disclosure.

The present disclosure is a method of integrating a light-trapping layer to a thin-film solar cell, where a composite light-trapping material is integrated into a thin-film solar cell. The present disclosure provides a substrate and grows a first transparent conductive oxide (TCO) layer; a first absorption layer obtained through a plasma process; a second TCO layer; and a metal grating on the substrate sequentially, where a plasmonic nanostructured layer is thus further formed during fabricating the above layers.

On integrating the composite light-trapping material into the thin-film solar cell as a light-inlet layer, the plasmonic nanostructured layer is formed on the second TCO layer; a third TCO layer is formed on the plasmonic nanostructured layer; and a metal back reflector layer is formed between the substrate and the first TCO layer. Thus, the composite light-trapping material is integrated into the thin-film solar cell.

Or, on integrating the composite light-trapping material into the thin-film solar cell as an intermediate layer, the plasmonic nanostructured layer is formed on the first absorption layer; a fourth TCO layer and a second absorption layer are formed on the plasmonic nanostructured layer; and a metal back reflector layer is formed between the substrate and the first TCO layer. Thus, the composite light-trapping material is integrated into the thin-film solar cell.

Or, on integrating the composite light-trapping material into the thin-film solar cell at a shaded layer, the plasmonic nanostructured layer is formed on the substrate. Thus, the composite light-trapping material is integrated into the thin-film solar cell.

Figure 1:
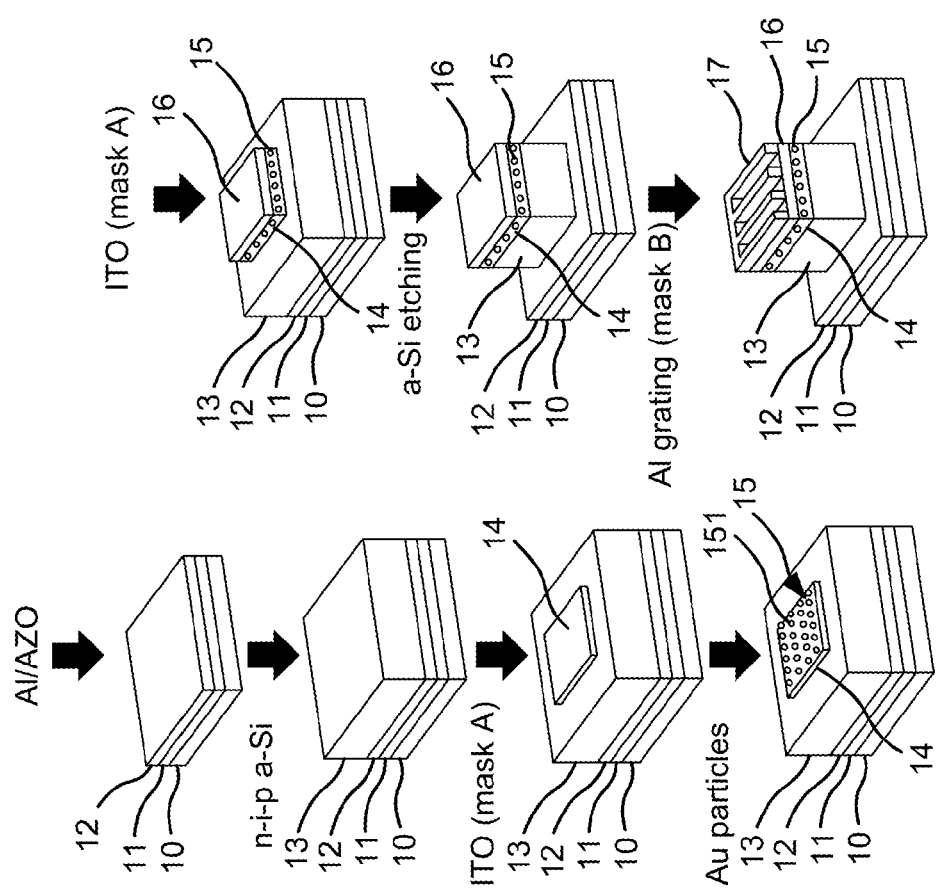

Please refer to FIG. 1, which is a flow view showing a preferred embodiment according to the present disclosure. As shown in the figure, a composite light-trapping material is integrated into a thin-film solar cell through the following steps:

(a) A substrate 10 is provided; and a metal back reflector layer 11 and a first TCO layer are formed on the substrate 10.

(b) A first absorption layer 13 is formed on the first TCO layer 12 through a plasma process.

(c) A second TCO layer 14 is formed on the first absorption layer 13 by using a mask.

(d) A plasmonic nanostructured layer 15 is formed on the second TCO layer 14, where the plasmonic nanostructured layer 15 comprises a plurality of nano-particles 151; and where the plasmonic nanostructured layer 15 is obtained through steps of thermal annealing, nano-plate process, spin coating, nano-imprinting, deep ultra-violet (UV) lithography and focus-ion-bean (FIB) process.

(e) A third TCO layer 16 is formed on the plasmonic nanostructured layer 15 by using the mask.

(f) The first absorption 13 layer is etched by using the third TCO layer 16 as a shield.

(g) A metal grating 17 is formed on the third TCO layer 16 by using another mask.

The substrate is a non-transparent substrate preferably made of an organic compound or a steel plate; or a transparent substrate preferably made of glass.

The first, the second and the third TCO layers 12, 14, 16 are separately made of indium tin oxide (ITO); zinc oxide (ZnO); aluminum zinc oxide (AZO or ZnO:Al); or tin dioxide doped with fluorine ($SnO_2$:F).

The metal back reflector layer 11 is a film made of a metal having a high reflectivity; and the metal is aluminum (Al) or silver (Ag), preferably The first absorption layer 13 is an n-i-p or p-i-n amorphous silicon (a-Si) tandem layer.

The nano-particles 151 are metal particles or dielectric particles, where the metal particle is preferably a gold (Au) particle or an Ag particle; and where the dielectric particle is preferably a silicon dioxide ($SiO_2$) particle, a silicon nitride ($Si_3N_4$) particle or a titanium dioxide ($TiO_2$) particle.

Thus, a composite light-trapping material is integrated into a thin-film solar cell.

The present disclosure is compatible to a general sputtering process used in fabricating a semiconductor integrated circuit (IC). The present disclosure can be applied to silicon (Si) thin-film solar cell; solar cell of heterojunction with intrinsic thin layer (HIT solar cell); organic thin-film solar cell; or copper indium gallium diselenide ($CuInGaSe_2$) thin-film solar cell, where a short circuit current is increased and a filling factor is improved. Thus, spectrum usage and photoelectrical conversion are enhanced.

Figure 2:
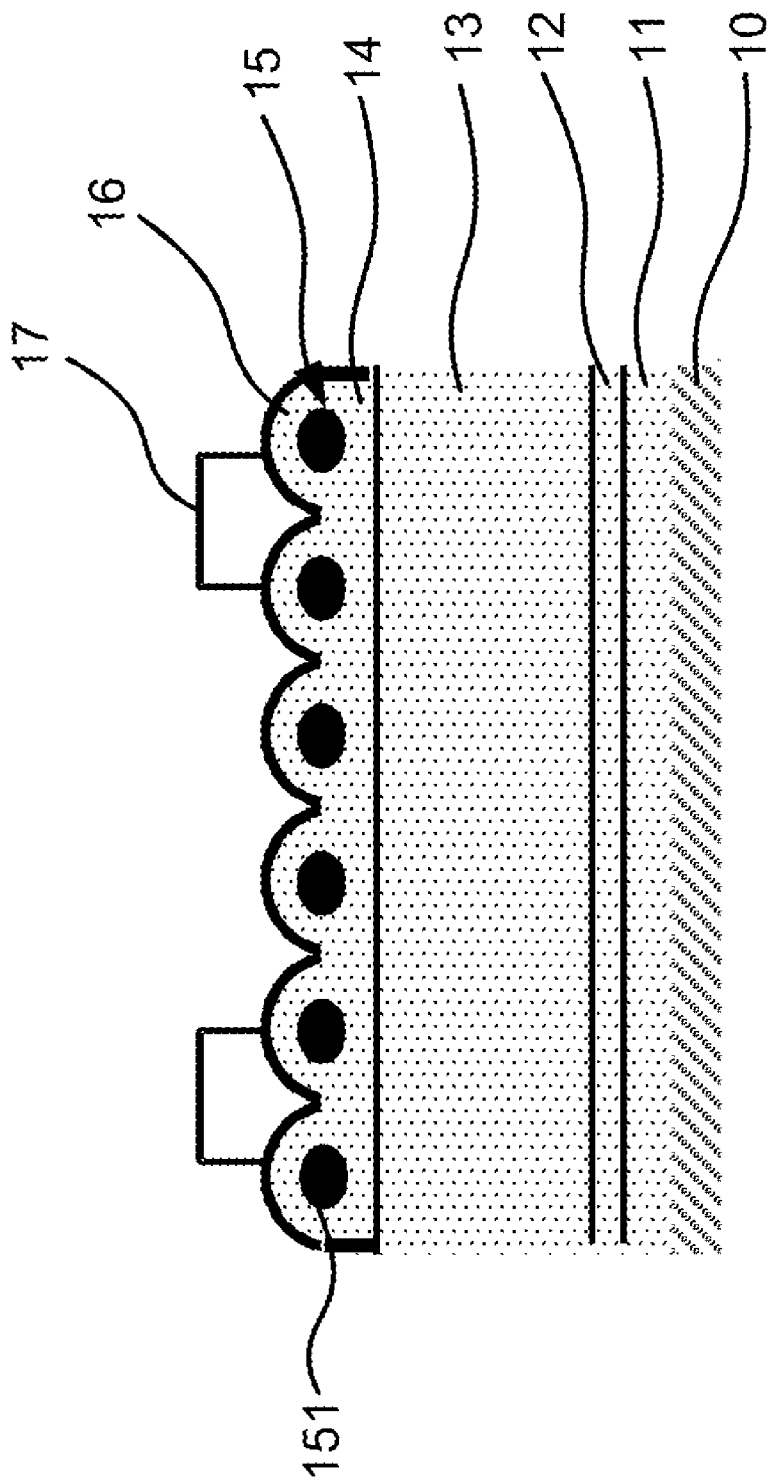
FIG. 2 is the sectional view showing the first integrated thin-film solar cells.

Please refer to FIG. 2, which is a sectional view showing a first integrated thin-film solar cell. As shown in the figure, a first integrated thin-film solar cell comprises a substrate 10; a metal back reflector layer 11 on the substrate 10; a first TCO layer 12 on the metal back reflector layer 11; a first absorption layer 13 on the first TCO layer 12; a second TCO layer 14 on the first absorption layer 13; a plasmonic nanostructured layer 15 on the second TCO layer 14; a third TCO layer 16 on the plasmonic nanostructured layer 15; and a metal grating 17 on the third TCO layer 16, where the plasmonic nanostructured layer 15 comprises a plurality of nano-particles 151.

Therein, a non-transparent substrate, which is made of an organic compound or a steel material, is used to obtain large-size nano-particles, which are metal nano-particles or dielectric nano-particles. A metal back reflector layer, a TCO layer and an absorption layer are formed on the substrate, where the metal back reflector layer is a metal film having a high reflectivity and is made of aluminum (Al) or silver (Ag); and where the absorption layer is made of an n-i-p solar cell material. Thus, a composite light-trapping nano-material is used to form a back reflector of solar cell. Or, a transparent substrate, is obtained to obtain small-size metal nano-particles, where the substrate is made of glass; and where a transparent conductive layer and an absorption layer, which is made of a p-i-n solar cell material, are thus formed. Thus, a composite light-trapping nano-material is used to form a surface plasmon layer of solar cell.

Figure 3:
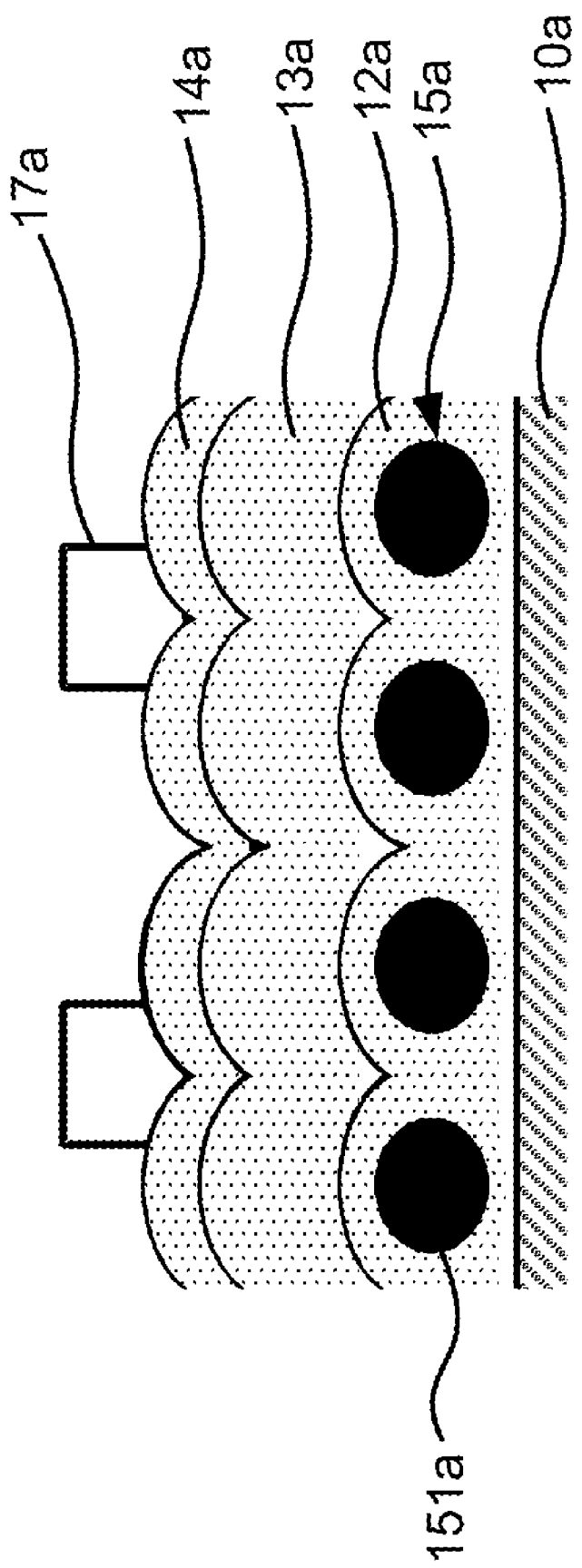
FIG. 3 is the sectional view showing the second integrated thin-film solar cells.

Please refer to FIG. 3, which is a sectional view showing a second integrated thin-film solar cell. As shown in the figure, a second integrated thin-film solar cell comprises a substrate 10$a$; a plasmonic nanostructured layer 15$a$ on the substrate 10$a$; a first TCO layer 12$a$ on the plasmonic nanostructured layer 15$a$; a first absorption layer 13$a$ on the first TCO layer 12$a$ formed through a plasma process; a second TCO layer 14$a$ on the first absorption layer 13$a$; and a metal grating 17$a$ on the second TCO layer 14$a$, where the plasmonic nanostructured layer 15$a$ comprises a plurality of nano-particles 151$a$.

Therein, a composite light-trapping nano-material is integrated as an a-Si:H bottom layer of n-i-p tandem layers for enhancing back reflectivity and further increasing optical path and absorption time in the absorption layer (at vertical direction). Furthermore, evanansence wave effect of surface plasmon is formed at horizontal direction for prolonging transverse wave's absorption time in the absorption layer.

Figure 4:
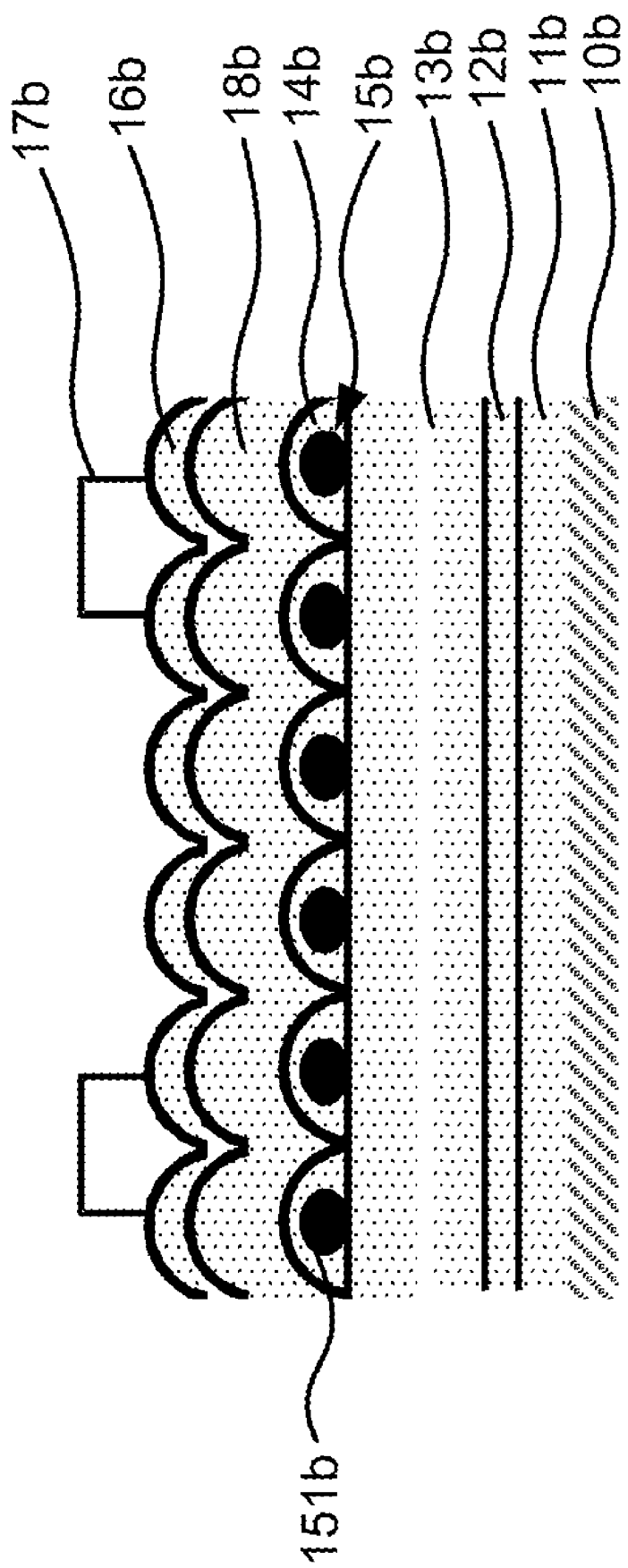
FIG. 4 is the sectional view showing the third integrated thin-film solar cells.

Please refer to FIG. 4, which is a sectional view showing a third integrated thin-film solar cell. As shown in the figure, a third integrated thin-film solar cell comprises a substrate 10$b$; a metal back reflector layer 11$b$ on the substrate 10$b$; a first TCO layer 12$b$ on the metal back reflector layer 11$b$; a first absorption layer 13$b$ on the first TCO layer 12$b$ obtained through a plasma process; a plasmonic nanostructured layer 15$b$ on the first absorption layer 13$b$; a second TCO layer 14$b$ on the plasmonic nanostructured layer 15$b$; a second absorption layer 18$b$ on the second TCO layer 14$b$; a third TCO layer 16$b$ on the second absorption layer 18$b$; and a metal grating 17$b$ on the third TCO layer 16$b$, where the plasmonic nanostructured layer 15$b$ comprises a plurality of nano-particles 151$b$.

Therein, small-size metal nano-particles are embedded between absorption layers 13$b$, 18$b$ so that more carriers are produced through impact ionization owing to quantum confinement effect. Mini-bands formed by quantum enhances transference of carrier and forms a structure of multiple energy levels, like multi junction of tandem solar cell, for improving absorption to full spectrum and improving collection of carriers.

Figure 5:
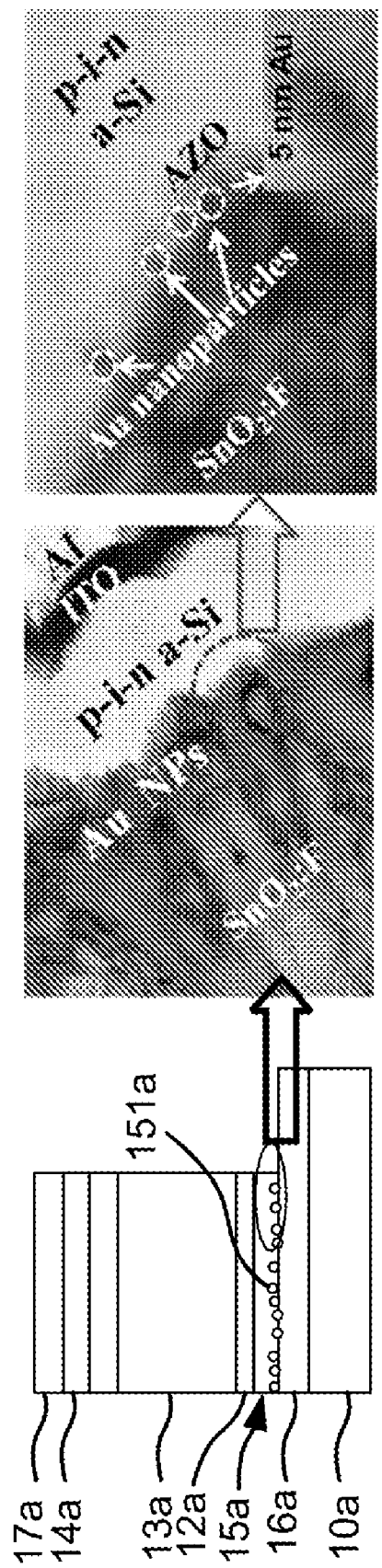
FIG. 5 is the view showing the second state of use under electron microscopy.
Figure 6:
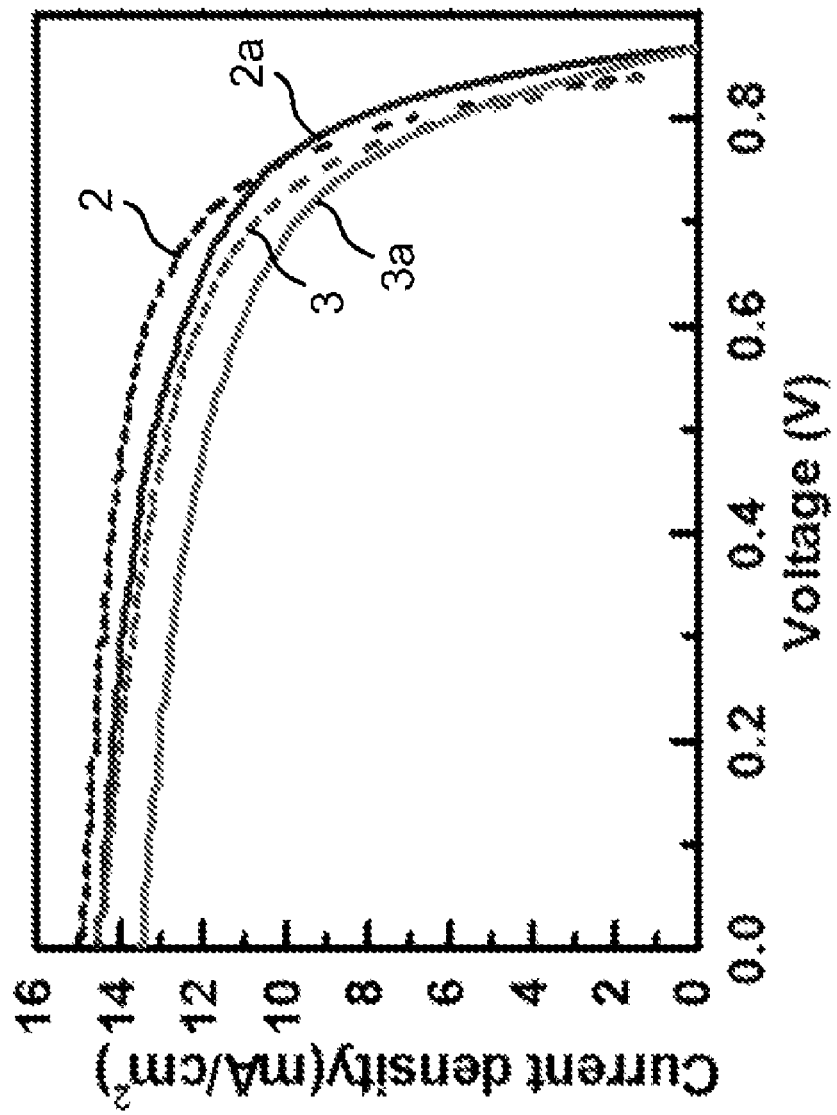
FIG. 6 is the view showing the curves of characteristics of the second state of use.
Figure 7:
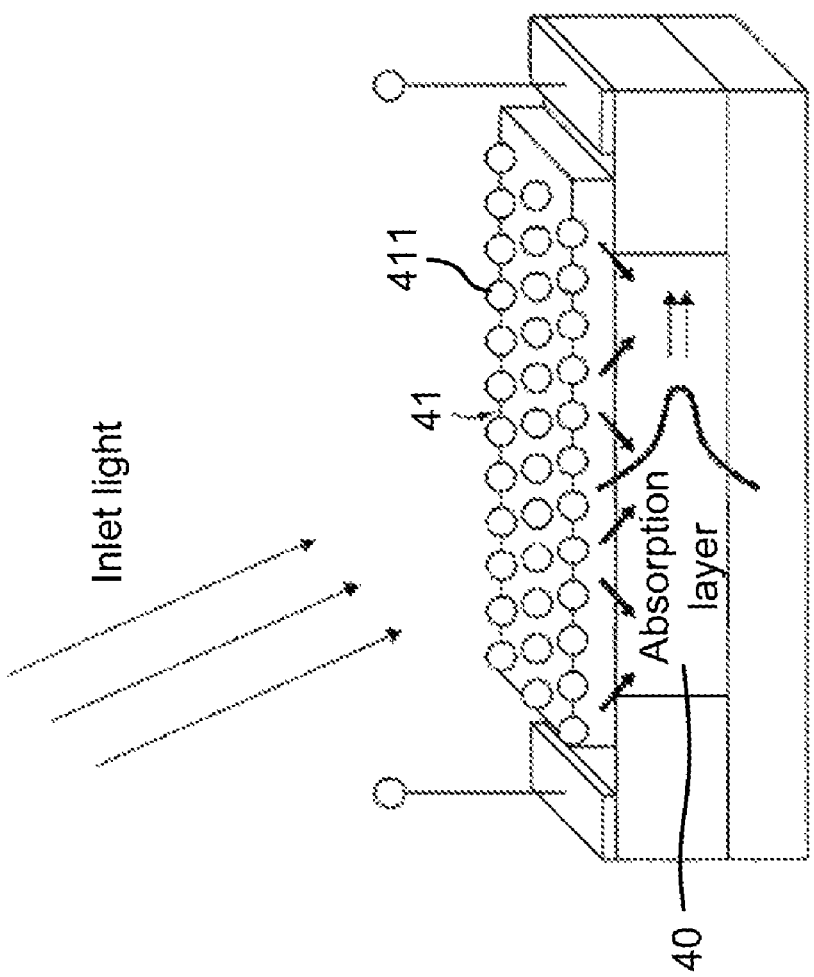
FIG. 7 is the view of surface plasma effect.
Figure 8:
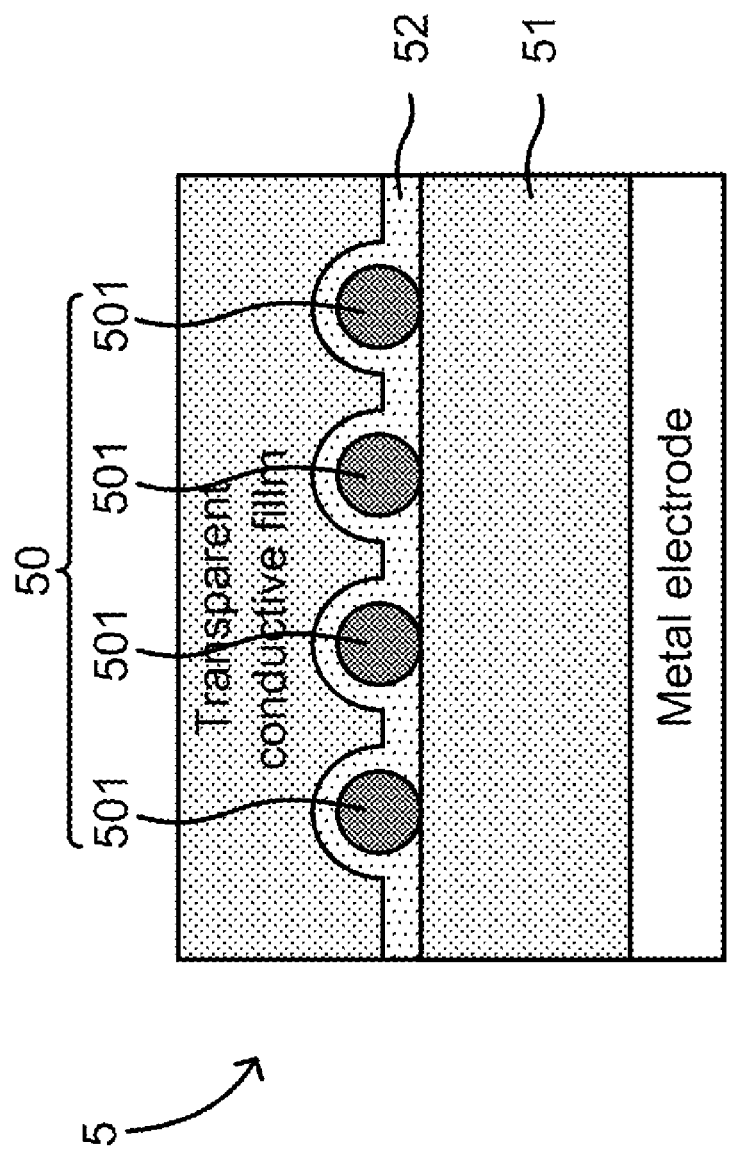
FIG. 8 is the view of the general tandem thin film photovoltaic device having a plasmon structure.
Figure 9:
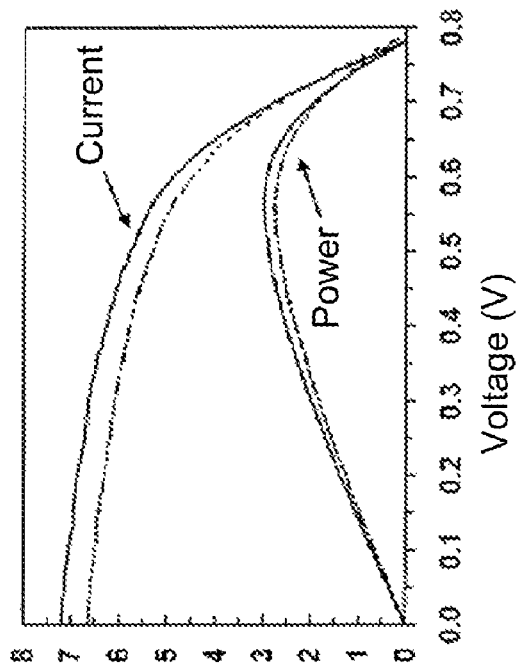
FIG. 9 is the view of the general photodetector.
Figure 9:
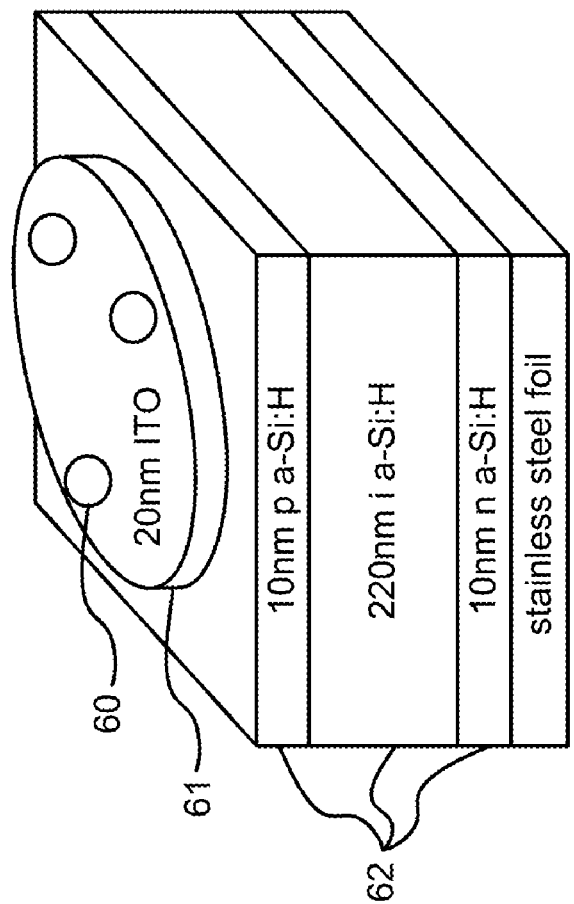
Figure 10:
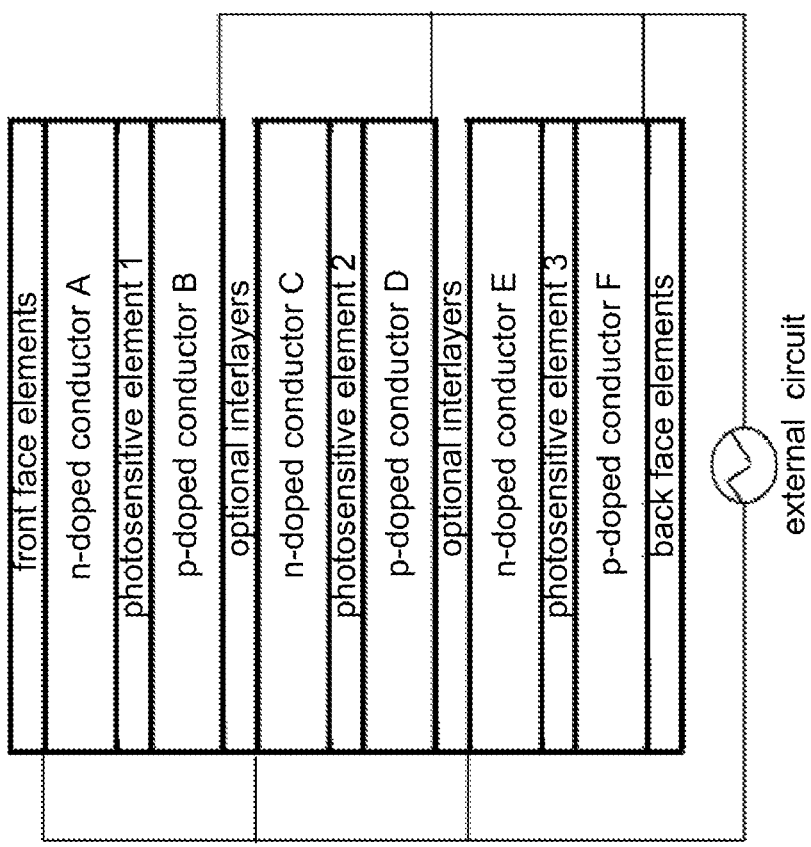
FIG. 10 is the view of the general photovoltaic cells.

Please refer to FIG. 5 and FIG. 6, which are a view showing the second state of use under electron microscopy; and a view showing curves of characteristics of the second state of use. As shown in the figures, nano-particles 151$a$ are clipped in a third TCO layer 16$a$. A composite light-trapping nano-material of $SnO_2$:F/Au/ZnO:Al is used in a p-i-n tandem a-Si solar cell. 5 nm Au nano-particles are embedded in a rough interface between $SnO_2$:F and ZnO:Al. In FIG. 6, I-V curves of the second state of use under 140° C. and 90° C. are shown. Two curves 2, 3 are for those embedded with Au nano-particles and the other two 2$a$, 3$a$ are for those not embedded with Au nano-particles. Under 140° C., efficiency reaches 8.5% for that embedded with Au nano-particles; and, under 90° C., 8.0%. Under 90° C., efficiency reaches 7.6% for that not embedded with Au nano-particles; and, under 90° C., 6.9%.

Owing to strong near-field optical effect of small-size Au nano-particles, the present disclosure obtains a good light-trapping effect under a best surface coverage ratio of nano-particles, and further enhances photocurrent density of a solar cell.

The present disclosure can be applied as a light-inlet layer of a Si thin-film solar cell, which has a gradient reflective structure for enhancing anti-reflective effect to inlet light; a periodic rough-surface structure for obtaining evanescent wave of surface plasmon at a transverse direction and increasing staying time of light in an absorption layer; a good integrity of all components; and a good reliability for long-time light-shining.

Thus, the present disclosure uses a composite light-trapping nano-material, where size and color of nano-particles and dielectric effects of TCO films are adjusted to change absorption bandwidth to an absorption layer for enhancing usage of the whole light bandwidths. Besides, the composite light-trapping nano-material decreases defects of interface between the absorption layer and the nano-material for improving electrical characteristics, decreasing pollution during fabricating nano-particles and integrating nano-particles into a thin-film solar cell as a light-inlet layer, an intermediate layer and a shaded layer. Thus, integrity and conversion ratio of a thin-film solar cell are effectively enhanced.

To sum up, the present disclosure is a method of integrating a light-trapping layer to a thin-film solar cell, where a sandwitched structure is formed with nano-particles embedded into a transparent conductive film; high reflectivity of a surface plasmon nano-structure and strong near-field optical effect are used to increase staying time of light in an absorption layer for increasing a photocurrent and improving performance with saved cost; defects of interface between the absorption layer and the nano-material are decreased; anti-reflective effect to inlet light is enhanced; and a good integrity and a good reliability for long-time light-shining are obtained.

The preferred embodiment herein disclosed is not intended to unnecessarily limit the scope of the disclosure. Therefore, simple modifications or variations belonging to the equivalent of the scope of the claims and the instructions disclosed herein for a patent are all within the scope of the present disclosure.

What is claimed is:

1. A method of integrating a light-trapping layer to a thin-film solar cell,
   wherein said method integrates a light-trapping layer into a thin-film solar cell as a light-inlet layer, comprising steps of:
   (a) obtaining a substrate and further obtaining a metal back reflector layer and a first transparent conductive oxide (TCO) layer on said substrate;
   (b) obtaining a first absorption layer on said first TCO layer through a plasma process;
   (c) obtaining a second TCO layer on said first absorption layer by using a mask;
   (d) obtaining a plasmonic nanostructured layer on said second TCO layer,
       wherein said plasmonic nanostructured layer comprises a plurality of nano-particles;
   (e) obtaining a third TCO layer on said plasmonic nanostructured layer by using said mask;
   (f) etching said first absorption layer by using said third TCO layer as a shield; and
   (g) obtaining a metal grating on said third TCO layer by using another mask.

2. The method according to claim 1,
wherein said substrate is a non-transparent substrate and is preferably made of a material selected from a group consisting of an organic compound and a steel material.

3. The method according to claim 1,
wherein said substrate is a transparent substrate and is preferably made of glass.

4. The method according to claim 1,
wherein said first, said second and said third TCO layers are separately made of a material selected from a group consisting of indium tin oxide (ITO); zinc oxide (ZnO); aluminum zinc oxide (AZO or ZnO:Al); and tin dioxide doped with fluorine ($SnO_2$:F).

5. The method according to claim 1,
wherein said metal back reflector layer is a film made of a metal having high reflectivity and said metal is preferably selected from a group consisting of aluminum (Al) and silver (Ag).

6. The method according to claim 1,
wherein said first absorption layer is an amorphous silicon (a-Si) tandem layer and said a-Si tandem layer is selected from a group consisting of an n-i-p layer and a p-i-n layer.

7. The method according to claim 1,
wherein said nano-particles are metal particles and said metal particle is preferably selected from a group consisting of a gold (Au) particle and an Ag particle.

8. The method according to claim 1,
wherein said nano-particles are dielectric particles and said dielectric particle is preferably selected from a group consisting of a silicon dioxide ($SiO_2$) particle, a silicon nitride ($Si_3N_4$) particle and a titanium dioxide ($TiO_2$) particle.

9. The method according to claim 1,
wherein said plasmonic nanostructured layer is obtained through steps of thermal annealing, nano-plate process, spin coating, nano-imprinting, deep ultra-violet (UV) lithography and focus-ion-bean (FIB) process.

10. The method according to claim 1,
wherein said light-trapping layer is selected from a group consisting of a surface plasmon layer and a back reflector layer.

11. The method according to claim 1,
wherein said thin-film solar cell is selected from a group consisting of a silicon (Si) thin-film solar cell; a heterojunction solar cell having intrinsic thin layer (HIT solar cell); an organic thin-film solar cell; and a copper indium gallium diselenide ($CuInGaSe_2$) thin-film solar cell.

12. A method of integrating a light-trapping layer to a thin-film solar cell,
wherein said method integrates a light-trapping layer into a thin-film solar cell as an intermediate layer, comprising steps of:
   (a) obtaining a substrate and further obtaining a metal back reflector layer and a first TCO layer on said substrate;
   (b) obtaining a first absorption layer on said first TCO layer through a plasma process;
   (c) obtaining a plasmonic nanostructured layer on said first absorption layer,
      wherein said plasmonic nanostructured layer comprises a plurality of nano-particles;
   (d) obtaining a second TCO layer on said plasmonic nanostructured layer by using a mask;
   (e) obtaining a second absorption layer on said second TCO layer through a plasma process;
   (f) obtaining a third TCO layer on said second absorption layer by using said mask; and
   (g) obtaining a metal grating on said third TCO layer by using another mask.

13. The method according to claim 12,
wherein said first, said second and said third TCO layers are separately made of a material selected from a group consisting of ITO, ZnO, AZO and $SnO_2$:F.

14. The method according to claim 12,
wherein said first and said second absorption layers are a-Si tandem layers and said a-Si tandem layer is selected from a group consisting of an n-i-p layer and a p-i-n layer.

15. The method according to claim 12,
wherein said nano-particles are metal particles and said metal particle is preferably selected from a group consisting of an Au particle and an Ag particle.

16. The method according to claim 12,
wherein said nano-particles are dielectric particles and said dielectric particle is preferably selected from a group consisting of a $SiO_2$ particle, a $Si_3N_4$ particle and a $TiO_2$ particle.

17. A method of integrating a light-trapping layer to a thin-film solar cell,
wherein said method integrates a light-trapping layer into a thin-film solar cell as a shaded layer, comprising steps of:
   (a) obtaining a substrate and further obtaining a plasmonic nanostructured layer and a first TCO layer on said substrate,
      wherein said plasmonic nanostructured layer comprises a plurality of nano-particles;
   (b) obtaining a first absorption layer on said first TCO layer through a plasma process;
   (c) obtaining a second TCO layer on said first absorption layer by using a mask; and
   (d) obtaining a metal grating on said second TCO layer by using another mask.

18. The method according to claim 17,
wherein said first and said second TCO layers are separately made of a material selected from a group consisting of ITO, ZnO, AZO and $SnO_2$:F.

19. The method according to claim 17,
wherein said first absorption layer is an a-Si tandem layer and said a-Si tandem layer is selected from a group consisting of an n-i-p layer and a p-i-n layer.

20. The method according to claim 17,
wherein said nano-particles are selected from a group consisting of metal particles and dielectric particles;
wherein said metal particle is preferably selected from a group consisting of an Au particle and an Ag particle; and
wherein said dielectric particle is preferably selected from a group consisting of a $SiO_2$ particle, a $Si_3N_4$ particle and a $TiO_2$ particle.

* * * * *